(12) United States Patent
Dhaoui et al.

(10) Patent No.: US 9,859,289 B2
(45) Date of Patent: Jan. 2, 2018

(54) NON-VOLATILE PUSH-PULL NON-VOLATILE MEMORY CELL HAVING REDUCED OPERATION DISTURB AND PROCESS FOR MANUFACTURING SAME

(71) Applicant: Microsemi SoC Corporation, San Jose, CA (US)

(72) Inventors: Fethi Dhaoui, Mountain House, CA (US); John McCollum, Orem, UT (US)

( * ) Notice: Subject to any disclaimer, the term of this patent is extended or adjusted under 35 U.S.C. 154(b) by 0 days.

(21) Appl. No.: 15/041,189

(22) Filed: Feb. 11, 2016

(65) Prior Publication Data

US 2016/0181262 A1 Jun. 23, 2016

Related U.S. Application Data

(62) Division of application No. 14/193,772, filed on Feb. 28, 2014, now Pat. No. 9,287,278.

(Continued)

(51) Int. Cl.
| | | |
|---|---|---|
| H01L 29/66 | (2006.01) | |
| H01L 27/11521 | (2017.01) | |
| H01L 27/24 | (2006.01) | |
| G11C 16/04 | (2006.01) | |
| G11C 16/34 | (2006.01) | |
| H01L 21/265 | (2006.01) | |
| H01L 21/28 | (2006.01) | |
| H01L 21/762 | (2006.01) | |
| H01L 21/8238 | (2006.01) | |
| H01L 23/528 | (2006.01) | |
| H01L 27/092 | (2006.01) | |

(Continued)

(52) U.S. Cl.
CPC .... *H01L 27/11521* (2013.01); *G11C 16/0441* (2013.01); *G11C 16/3418* (2013.01); *H01L 21/26513* (2013.01); *H01L 21/28035* (2013.01); *H01L 21/324* (2013.01); *H01L 21/76224* (2013.01); *H01L 21/823814* (2013.01); *H01L 21/823864* (2013.01); *H01L 21/823871* (2013.01); *H01L 21/823878* (2013.01); *H01L 21/823892* (2013.01); *H01L 23/528* (2013.01); *H01L 27/092* (2013.01); *H01L 27/0928* (2013.01); *H01L 27/2436* (2013.01); *H01L 29/0649* (2013.01); *H01L 29/0847* (2013.01); *H01L 29/167* (2013.01); *H01L 29/66575* (2013.01); *H01L 29/7833* (2013.01); *H01L 2924/0002* (2013.01)

(58) Field of Classification Search
CPC .................. H01L 27/11521; H01L 27/2436
See application file for complete search history.

(56) References Cited

U.S. PATENT DOCUMENTS 5,254,866 A * 10/1993 Ogoh .................. H01L 29/6656
257/344
5,801,415 A * 9/1998 Lee .................... H01L 29/42324
257/314

(Continued)

*Primary Examiner* — Jamie C Niesz
(74) *Attorney, Agent, or Firm* — Cisio & Thomas, LLP

(57) ABSTRACT

A non-volatile memory cell includes a p-channel non-volatile transistor having a source and a drain defining a channel and a gate overlying the channel and an n-channel non-volatile transistor having a source and a drain defining a channel and a gate overlying the channel. In at least one of the p-channel non-volatile transistor and the n-channel non-volatile transistor, a lightly-doped drain region extends from the drain into the channel.

6 Claims, 5 Drawing Sheets

Related U.S. Application Data

(60) Provisional application No. 61/771,665, filed on Mar. 1, 2013.

(51) Int. Cl.
*H01L 29/06* (2006.01)
*H01L 29/08* (2006.01)
*H01L 29/167* (2006.01)
*H01L 29/78* (2006.01)
*H01L 21/324* (2006.01)

(56) References Cited

U.S. PATENT DOCUMENTS

| | | | | |
|---|---|---|---|---|
| 6,063,663 A * | 5/2000 | Caprara | ............... | H01L 27/105 257/E21.687 |
| 6,784,476 B2 * | 8/2004 | Kim | ............... | H01L 27/115 257/296 |
| 7,078,295 B2 * | 7/2006 | Jeon | ............... | H01L 27/115 257/E21.682 |
| 7,232,717 B1 * | 6/2007 | Choi | ............... | H01L 27/105 257/E21.682 |
| 7,339,232 B2 * | 3/2008 | Seo | ............... | G11C 16/0458 257/319 |
| 7,928,492 B2 * | 4/2011 | Jeon | ............... | H01L 27/115 257/314 |
| 2003/0222303 A1 * | 12/2003 | Fukuda | ............... | H01L 29/7923 257/321 |
| 2006/0051927 A1 * | 3/2006 | Takami | ............... | H01L 21/28123 438/307 |
| 2007/0075352 A1 * | 4/2007 | Irie | ............... | H01L 21/28282 257/314 |
| 2007/0108508 A1 * | 5/2007 | Lin | ............... | G11C 16/0466 257/324 |
| 2007/0109861 A1 * | 5/2007 | Wang | ............... | G11C 16/0425 365/185.18 |
| 2011/0002167 A1 * | 1/2011 | McCollum | ............... | H01L 27/2436 365/185.07 |
| 2012/0223381 A1 * | 9/2012 | Lu | ............... | H01L 21/28282 257/324 |
| 2014/0175531 A1 * | 6/2014 | Huang | ............... | H01L 21/28282 257/324 |
| 2014/0246719 A1 * | 9/2014 | Dhaoui | ............... | H01L 27/11521 257/336 |

\* cited by examiner

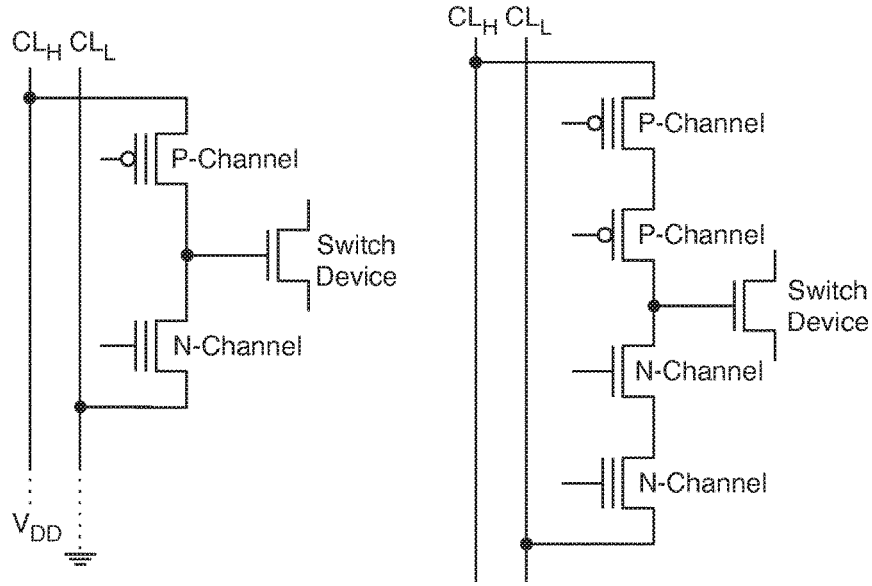
FIGURE 1A
(PRIOR ART)
FIGURE 1B
(PRIOR ART)
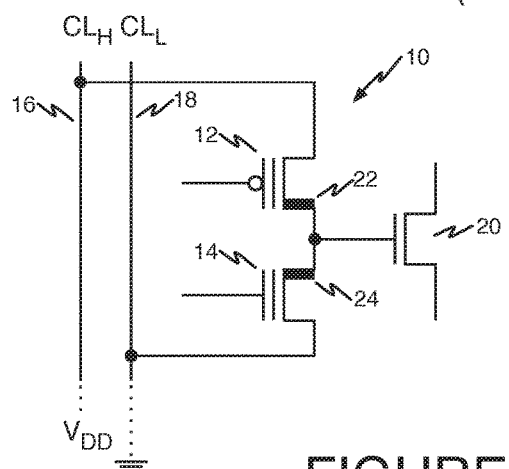
FIGURE 2

NON-VOLATILE PUSH-PULL NON-VOLATILE MEMORY CELL HAVING REDUCED OPERATION DISTURB AND PROCESS FOR MANUFACTURING SAME

CROSS REFERENCE TO RELATED APPLICATION

This application is a divisional of U.S. patent application Ser. No. 14/193,772, filed Feb. 28, 2014, which claims the benefit of U.S. Provisional Patent Application No. 61/771,665, filed Mar. 1, 2013, and titled, "Non-Volatile Push-Pull Non-Volatile Memory Cell Having Reduced Operation Disturb and Process for Manufacturing Same", the contents of which are incorporated herein by reference in their entirety.

BACKGROUND OF THE INVENTION

Field of the Invention

The present invention relates to semiconductor technology, and specifically to MOS non-volatile memory technology. More particularly, the present invention relates to MOS non-volatile memory cells having reduced operation disturb and to methods for fabricating such memory cells.

Description of Related Art

Operation mode disturb is an issue in push-pull memory cell designs. Such designs include a non-volatile n-channel floating gate memory transistor and a non-volatile p-channel floating gate memory transistor connected in series between a high column line ($CL_H$) and a low column line ($CL_L$). During normal operation of the memory containing the memory cell, $CL_H$ is coupled to $V_{DD}$ and $CL_L$ is coupled to ground. FIG. 1A shows a typical push-pull memory cell design including a p-channel non-volatile transistor in series with an n-channel non-volatile transistor driving a switch device (shown as a volatile n-channel transistor having its gate connected to the common drain connection of the n-channel floating gate transistor and the p-channel floating gate transistor). The memory cell is programmed (or erased) such that only one of the two memory transistors is turned on and the other transistor remains off. When the p-channel memory transistor is turned off and the n-channel memory transistor is turned on, the output of the memory cell is "low" and is near ground. When the p-channel memory transistor is turned on and the n-channel memory transistor is turned off, the output of the memory cell is "high" and is near $V_{DD}$.

Operation mode disturb occurs during normal operation of the memory array. When the n-channel memory transistor is turned off and the p-channel memory transistor is turned on, the n-channel memory transistor is subject to a drain edge stress because the common drain connection of the p-channel memory transistor and the n-channel memory transistor is at $V_{DD}$ potential. This stress, which occurs over the lifetime of the device, will cause the n-channel transistor to lose electrons and eventually begin to turn on. When the memory device is used as a configuration memory in a user-programmable logic device, this action will begin to turn off the configuration switch device connected to the memory cell.

When the p-channel memory transistor is turned off and the n-channel memory transistor is turned on, the p-channel memory transistor is subject to a drain edge stress because the common drain connection of the p-channel memory transistor and the n-channel memory transistor is at ground potential. This stress, which occurs over the lifetime of the device, will cause the p-channel transistor to lose electrons and eventually begin to turn on. The p-channel case is worse than the n-channel case because hot electrons are more easily transported through the gate oxide of the memory transistor than are holes. When the memory device is used as a configuration memory in a user-programmable logic device, this action will begin to turn on the configuration switch device connected to the memory cell.

Either of the above-described conditions will eventually result in product functional failure. Existing solutions involve adding a p-channel volatile transistor in series with the p-channel memory transistor. An n-channel volatile transistor can also be added in series with the n-channel memory transistor. Such a configuration with both an n-channel volatile transistor and a p-channel volatile transistor is shown in FIG. 1B. During read mode, both the n-channel volatile transistor and the p-channel volatile transistor are turned on. The solution implemented by the circuit of FIG. 1B significantly adds to the size of the memory cell and increases the metal line overhead for the memory array.

SUMMARY OF THE INVENTION

The present invention provides a solution for suppressing operation disturb for a push-pull memory cell according to the present invention.

Rather than adding an additional device as in the prior art solutions to this problem, the present invention introduces a lightly-doped extension on at least the drain-side diffusion of one or both of the non-volatile memory transistors, thereby reducing the e-field across the dielectric between the drain and the gate. The amount of the field reduction is inversely proportional to the doping concentration and the length of this extension. As the voltage across the device increases and the thickness of the gate dielectric decreases, the e-field that must be reduced according to the teachings of the present invention increases.

In accordance with a first embodiment of the present invention, the extension may be simply a lightly-doped drain (LDD). In this embodiment, the device will have an asymmetric LDD doping in which a higher LDD doping level is present on the source side than the LDD doping level present on the drain side to provide both good performance and a better drain disturb characteristic.

In accordance with another embodiment of the present invention, an extended lightly-doped drain (LDD) is provided at the drain side of both the p-channel and the n-channel memory transistors. This extension is constructed with LDD implant and source/drain and silicate salicide block offsets. According to one variation, the drain side LDD has a lighter doping than the source side LDD. According to another variation, the LDD region extending from the source is shorter than the LDD region extending from the drain.

In accordance with a further aspect of the present invention, the differential LDD doping and extended drain side LDD techniques may be used in combination.

BRIEF DESCRIPTION OF THE DRAWINGS

Additional advantages and details of the invention are explained below with reference to the exemplary embodiments illustrated in the accompanying schematic figures, in which like reference numbers identify like parts throughout.

FIG. 1A is a diagram illustrating a typical prior art non-volatile memory cell.

FIG. 1B is a diagram illustrating another prior art memory cell including additional devices to prevent operation disturb.

FIG. 2 is a diagram of a non-volatile memory cell in accordance with the present invention.

DESCRIPTION OF THE INVENTION

Figure 3:
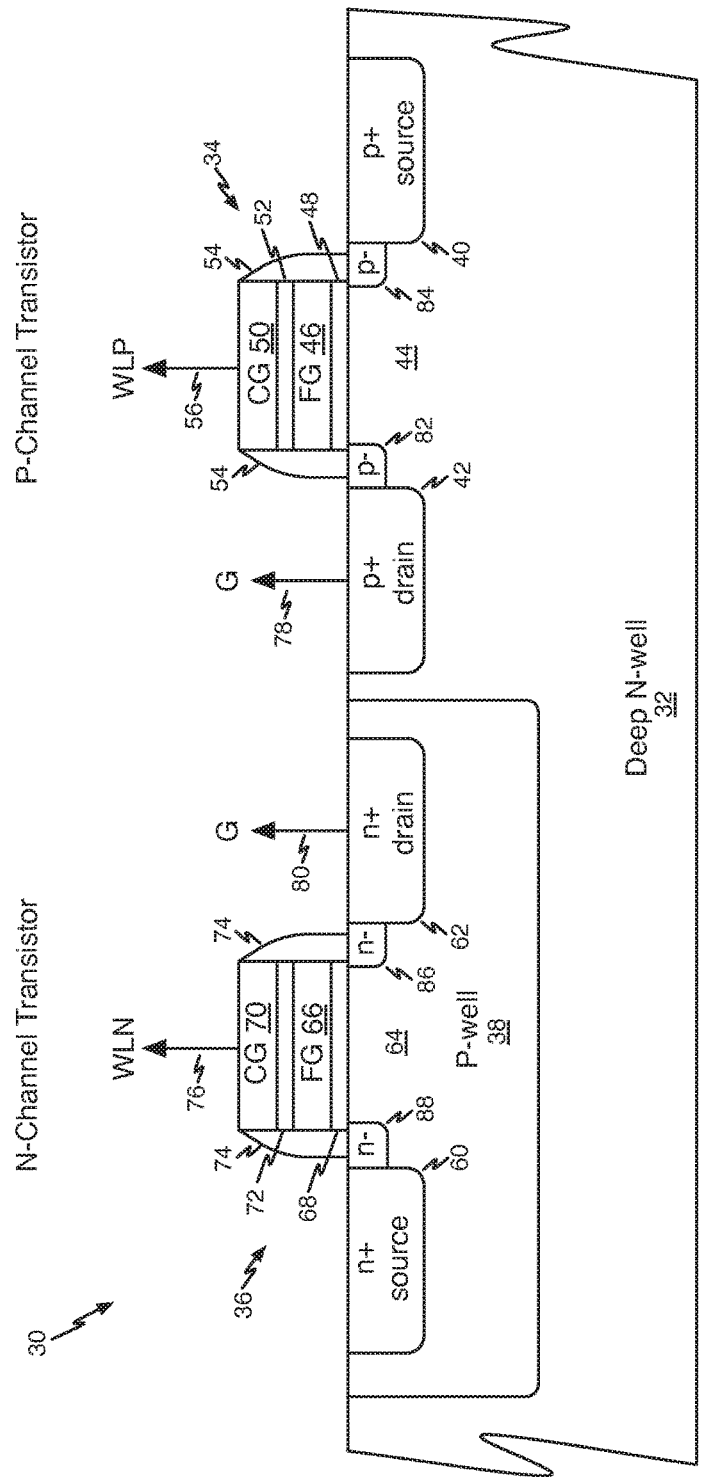
FIG. 3 is a cross-sectional view of a memory cell according to one aspect of the present invention.

Persons of ordinary skill in the art will realize that the following description of the present invention is illustrative only and not in any way limiting. Other embodiments of the invention will readily suggest themselves to such skilled persons.

Persons of ordinary skill in the art will realize that the concept of the present invention of employing a lightly-doped LDD region to decrease the voltage stress on the charge storage region can be applied to all eNVM transistors. This includes variations of the disclosed cells, such as Flash, EEPROM, SONOS or Nitride, Split Gate types, and NanoCrystal, etc. The type of stress dealt with by the techniques of the present invention is commonly called drain disturb or column disturb, which is very sensitive to excessive voltages being applied to the drain of an eNVM cell causing the stored charge to be disturbed.

Referring now to FIG. 2, a diagram shows a non-volatile memory cell 10 according to an aspect of the present invention. Memory cell 10 includes a p-channel non-volatile transistor 12 connected in series with an n-channel non-volatile transistor 14 between a high column line ($CL_H$) 16 and a low column line ($CL_L$) 18. During normal operation of the memory containing the memory cell 10, $CL_H$ 16 is coupled to $V_{DD}$ and $CL_L$ 18 is coupled to ground, as shown in FIG. 2. During programming and erasing of memory cell 10, $CL_H$ 16 and $CL_L$ 18 are coupled to programming and erase potentials appropriate for the memory transistor technology employed, as is well known in the art. The memory cell 10 is programmed (or erased) such that only one of the two memory transistors 12 and 14 is turned on and the other transistor remains off. When the p-channel memory transistor 12 is turned off and the n-channel memory transistor 14 is turned on, the output of the memory cell is "low" and is near ground. When the p-channel memory transistor 12 is turned on and the n-channel memory transistor 14 is turned off, the output of the memory cell is "high" and is near $V_{DD}$.

The common drain connection of the p-channel memory transistor 12 and the n-channel memory transistor 14 is coupled to the gate of a volatile n-channel switch transistor 20. Switch transistor 20 is used to make a programmable connection between two circuit nets or to provide a high or low logic level to a device or circuit in a user-programmable circuit, as is well known in the art.

The drain region of the p-channel memory transistor 12 includes a lightly-doped drain region 22 and the drain region of then-channel memory transistor 14 includes a lightly-doped drain region 24.

Referring now to FIG. 3, a cross-sectional view is presented of a memory cell 30 according to one aspect of the present invention. Memory cell 30 is formed in an n-type semiconductor substrate 32. As will be appreciated by persons of ordinary skill in the art, the n-type semiconductor substrate 32 may be a deep n-well in a semiconductor substrate. P-channel memory transistor 34 is formed in substrate 32. N-channel memory transistor 36 is formed in p-well 38 disposed in substrate 32. In an illustrative and non-limiting embodiment of the present invention, substrate 32 may be a deep n-well having a depth of between about 0.40 μm and about 2 μm, doped with phosphorus to a concentration of between about 1E15 atoms/cm$^3$ and about 1E18 atoms/cm$^3$, and p-well 38 may have a depth of between about 0.40 μm and about 1.5 μm, and may be doped with boron to a concentration of between about 1E15 atoms/cm$^3$ and about 1E18 atoms/cm$^3$.

P-channel memory transistor 34 includes source 40 and drain 42, defining a channel region 44. P-channel memory transistor 34 also includes a floating gate 46 insulated from the surface of substrate 32 by a gate dielectric layer 48. A control gate 50 is disposed above and self-aligned with floating gate 46. Control gate 50 is insulated from floating gate 46 by an inter-gate dielectric layer 52. Silicate salicide spacers 54 are formed at the sides of the gate stack including floating gate 46 and control gate 50. P-channel word line (WLP) 56 for the memory cell 30 is connected to control gate 50. Source and drain regions 40 and 42 may be doped with BF$^2$ or boron to a concentration of between about 1E19 atoms/cm$^3$ and about 1E20 atoms/cm$^3$.

N-channel memory transistor 36 includes source 60 and drain 62, defining a channel region 64. N-channel memory transistor 36 also includes a floating gate 66 insulated from the surface of p-well 38 by a gate dielectric layer 68. A control gate 70 is disposed above and self-aligned with floating gate 66. Control gate 70 is insulated from floating gate 66 by an inter-gate dielectric layer 72. Spacers 74 are formed at the sides of the gate stack including floating gate 66 and control gate 70. N-channel word line (WLN) 76 for the memory cell 30 is connected to control gate 70. Persons of ordinary skill in the art will appreciate that the gate dielectric layers 48 and 68 can be formed and defined in the same processing steps, and that the same holds true for floating gates 46 and 66, inter-gate dielectric layers 52 and 72, and control gates 50 and 70. Source and drain regions 60 and 62 may be doped with arsenic to a concentration of between about 1E19 atoms/cm$^3$ and about 1E20 atoms/cm$^3$.

The drain of P-channel memory transistor 34 and the drain of N-channel memory transistor 36 are connected to a control line G by lines indicated at reference numerals 78 and 80, respectively. Control line G is coupled to a switch transistor (not shown) that will be controlled by the memory cell, as described above.

The drain of P-channel memory transistor 34 includes a lightly-doped drain (LDD) 82 that extends into the channel region 44 under the gate stack. The source of P-channel memory transistor 34 also includes an LDD region 84 that extends into the channel region 44 under the gate stack. LDD region 82 on the drain side of P-channel memory transistor 34 may be doped with boron to a concentration of between about 1E16 atoms/cm$^3$ and about 1E18 atoms/cm$^3$. LDD region 84 on the source side of P-channel memory transistor 34 may be doped with BF$^2$ or boron to a concentration of between about 5E16 atoms/cm$^3$ and about 5E18 atoms/cm$^3$. In a typical embodiment, the LDD regions 82 and 84 extend past the channel-side edges of drain and source regions 40 and 42 by about between 0.01 μm and about 0.1 μm, and, thus, extend under the edges of the polysilicon gate stack.

Similarly, N-channel memory transistor 36 includes a LDD region 86 that extends into the channel region 64 under the gate stack. The source of N-channel memory transistor 36 also includes an LDD region 88 that extends into the channel region 64 under the gate stack. LDD region 86 on the drain side of N-channel memory transistor 36 may be doped with arsenic or phosphorus to a concentration of between about 1E16 atoms/cm$^3$ and about 1E18 atoms/cm$^3$. LDD region 88 on the source side of N-channel memory transistor 36 may be doped with arsenic or phosphorus to a concentration of between about 5E16 atoms/cm$^3$ and about 5E18 atoms/cm$^3$. In a typical embodiment, the LDD regions 86 and 88 extend past the channel-side edges of source and drain regions 60 and 62 by about between 0.01 μm and 0.1 μm.

Persons of ordinary skill in the art will observe that the LDD doping of P-channel memory transistor 34 and N-channel memory transistor 36 is asymmetrical, with the lower doping level being present at the drain side of the transistor in each case. In this embodiment of the present invention, the asymmetric LDD doping with a higher LDD dose on the source side and lighter LDD dose on the drain side provide a good performance and a better drain disturb characteristic because the lighter doping allows voltage drop to be spread across the space charge region of the LDD, putting less stress on the gate dielectric. As will be appreciated by persons of ordinary skill in the art, the relative doping levels of the source/drain regions and the LDD regions in any actual embodiment of the invention will be chosen as desired depending on the voltages to be encountered as well as the memory device geometries.

Figure 4:
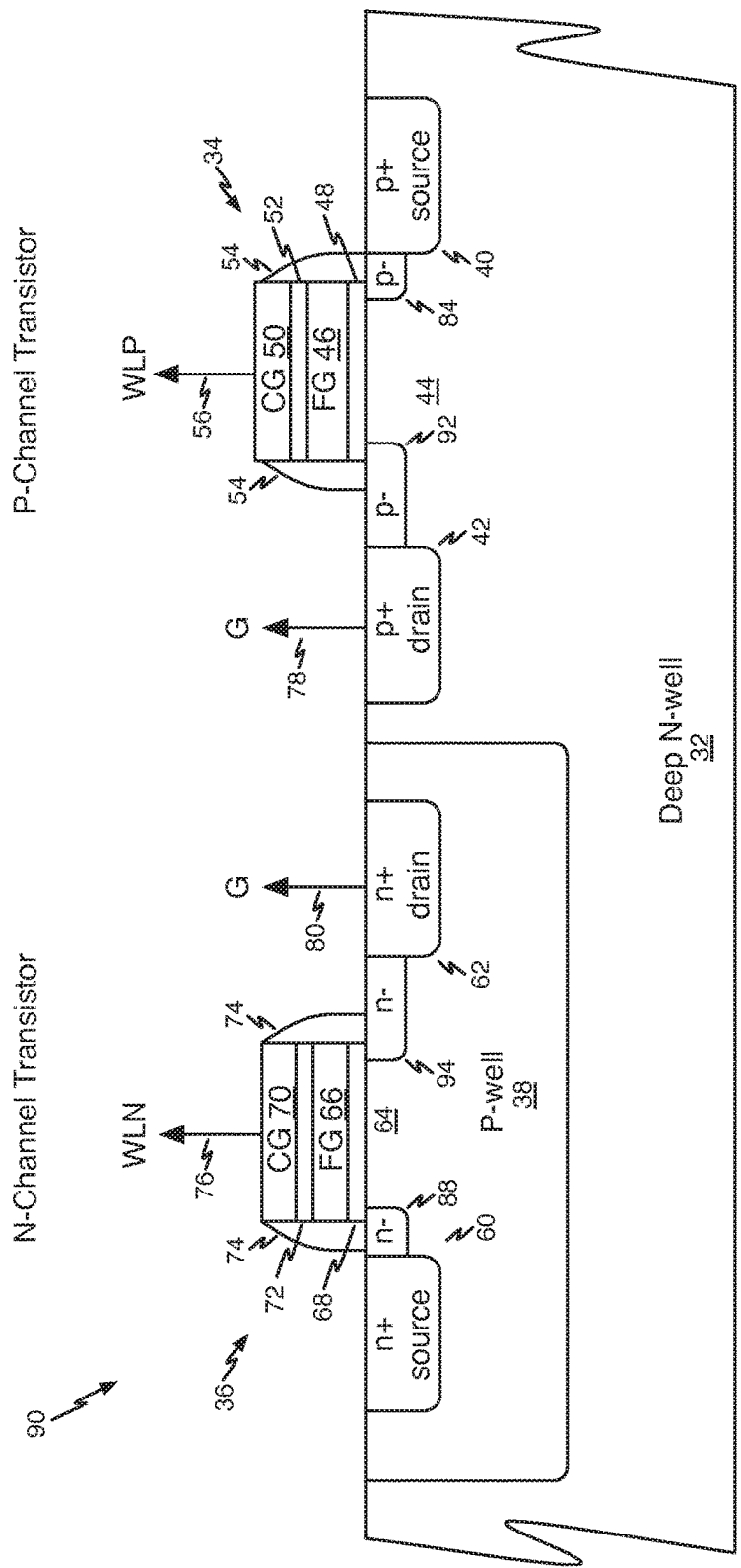
FIG. 4 is a cross-sectional view of a memory cell according to another aspect of the present invention.

Referring now to FIG. 4, a cross-sectional view is presented of a memory cell 90 according to one aspect of the present invention. Many of the features of memory cell 90 are similar to features of memory cell 30 of FIG. 3. For an ease of understanding of the invention, features in the embodiment of FIG. 4 that are the same as corresponding features of the embodiment depicted in FIG. 3 will be identified by the same reference numerals used to identify the corresponding structure in FIG. 3.

Memory cell 90 is formed m an n-type semiconductor substrate 32. As in the embodiment of FIG. 3, n-type semiconductor substrate 32 may be a deep n-well in a semiconductor substrate. P-channel memory transistor 34 is formed in substrate 32. N-channel memory transistor 36 is formed in p-well 38 disposed in substrate 32. In an illustrative and non-limiting embodiment of the present invention, substrate 32 may be a deep n-well having a depth of between about 0.40 μm and about 2 μm, doped with phosphorus to a concentration of between about 1E15 atoms/cm$^3$ and about 1E18 atoms/cm$^3$, and p-well 38 may have a depth of between about 0.40 μm and about 1.5 μm, and may be doped with boron to a concentration of between about 1E15 atoms/cm$^3$ and about 1E18 atoms/cm$^3$.

P-channel memory transistor 34 includes source 40 and drain 42, defining a channel region 44. P-channel memory transistor 34 also includes a floating gate 46 insulated from the surface of substrate 32 by a gate dielectric layer 48. A control gate 50 is disposed above and self-aligned with floating gate 46. Control gate 50 is insulated from floating gate 46 by an inter-gate dielectric layer 52. Spacers 54 are formed at the sides of the gate stack including floating gate 46 and control gate 50. P-channel word line (WLP) 56 for the memory cell 90 is connected to control gate 50. Source and drain regions 40 and 42 may be doped with boron or BF$^2$ to a concentration of between about 1E18 atoms/cm$^3$ and about 1E20 atoms/cm$^3$.

N-channel memory transistor 36 includes source 60 and drain 62, defining a channel region 64. N-channel memory transistor 36 also includes a floating gate 66 insulated from the surface of p-well 38 by a gate dielectric layer 68. A control gate 70 is disposed above and self-aligned with floating gate 66. Control gate 70 is insulated from floating gate 66 by an inter-gate dielectric layer 72. Spacers 74 are formed at the sides of the gate stack including floating gate 66 and control gate 70. N-channel word line (WLN) 76 for the memory cell 90 is connected to control gate 70. Persons of ordinary skill in the art will appreciate that the gate dielectric layers 48 and 68 can be formed and defined in the same processing steps, and that the same holds true for floating gates 46 and 66, inter-gate dielectric layers 52 and 72, and control gates 50 and 70. Source and drain regions 60 and 62 may be doped with arsenic or phosphorus to a concentration of between about 1E18 atoms/cm$^3$ and about 1E20 atoms/cm$^3$.

As described above, the drain of P-channel memory transistor 34 and the drain of N-channel memory transistor 36 are connected to a control line G by lines indicated at reference numerals 78 and 80, respectively. Control line G is coupled to a switch transistor (not shown) that will be controlled by the memory cell.

The drain 42 of P-channel memory transistor 34 includes a lightly-doped drain (LDD) 92 that extends into the channel region 44 under the gate stack. The source of P-channel memory transistor 34 also includes an LDD region 84 that extends into the channel region 44 under the gate stack. LDD regions 92 and 84 of P-channel memory transistor 34 may be doped with boron to a concentration of between about 1E16 atoms/cm$^3$ and about 1E18 atoms/cm$^3$. As maybe observed from an examination of FIG. 4, a difference between the embodiment of FIGS. 3 and 4 is that the drain side LDD region 92 in the embodiment of FIG. 4 extends further outward into the channel region 44 from the edge of drain region 42 than LDD region 84 extends into the channel region 44 on the source side of the device. In a typical embodiment, the LDD region 84 extends past the channel-side of source region 40 by between about 0.01 μm and about 0.1 μm. The LDD region 92 extends past the channel-side of drain region 42 by between about 0.2 μm and about 1.0 μm.

Similarly, N-channel memory transistor 36 includes an LDD region 94 that extends into the channel region 64 under the gate stack. The source of N-channel memory transistor 36 also includes an LDD region 88 that extends into the channel region 64 under the gate stack. LDD regions 94 and 88 of N-channel memory transistor 36 may be doped with arsenic or phosphorus to a concentration of between about 1E16 atoms/cm$^3$ and about 1E18 atoms/cm$^3$. As may be observed from an examination of FIG. 4, the drain side LDD region 94 extends further outward into the channel region 64 from the edge of drain region 62 than LDD region 88 extends into the channel region 64 on the source side of the device. In a typical embodiment, the LDD region 94 extends past the channel-side of drain region 62 by between about 0.2 μm and about 1.0 μm. The LDD region 88 extends past the channel-side of source region 60 by between about 0.01 μm and about 0.1 μm.

In this embodiment of the present invention, the asymmetric LDD geometry with a longer LDD region on the drain side of the devices provide a good performance and a better drain disturb characteristic because the longer length of the LDD region allows voltage drop to be spread across the space charge region of the drain side LDD. As will be appreciated by persons of ordinary skill in the art, the relative doping levels of the source/drain regions and the lengths of the LDD regions in any actual embodiment of the invention will be chosen as desired depending on the voltages to be encountered as well as the memory device geometries.

Figure 5:
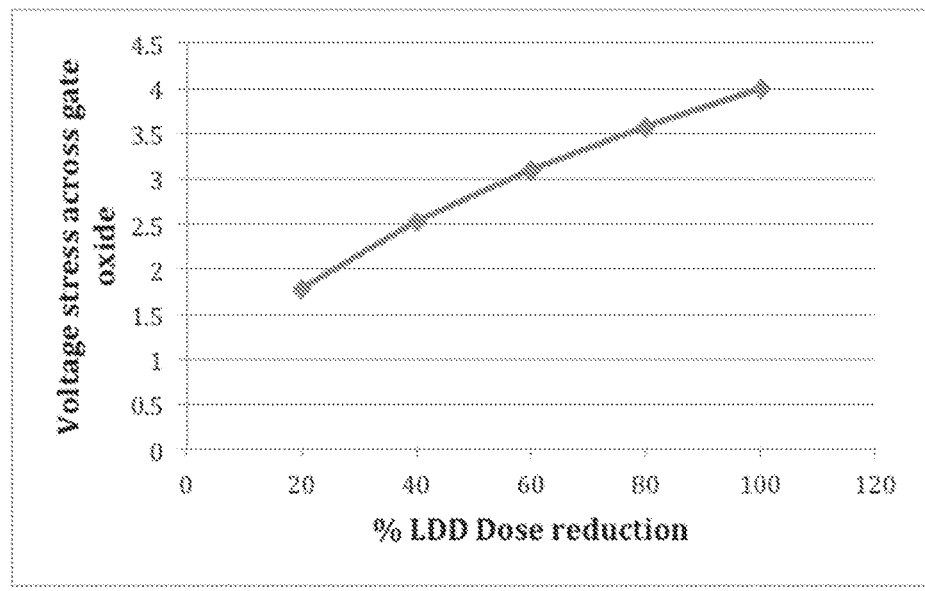
FIG. 5 is a plot showing the relationship between LDD dose reduction and voltage stress across the gate oxide according to the present invention.

The voltage across the gate oxide and, therefore, the lifetime of the gate oxide is determined by the voltage that is applied to the gate electrode and the voltage at the channel edge. The voltage at the channel edge is the voltage applied to the drain minus the voltage drop across the space charge region of the LDD. FIG. 5 presents a sample plot below showing the relationship between LDD dose reduction and voltage stress across the gate oxide.

Figure 6:
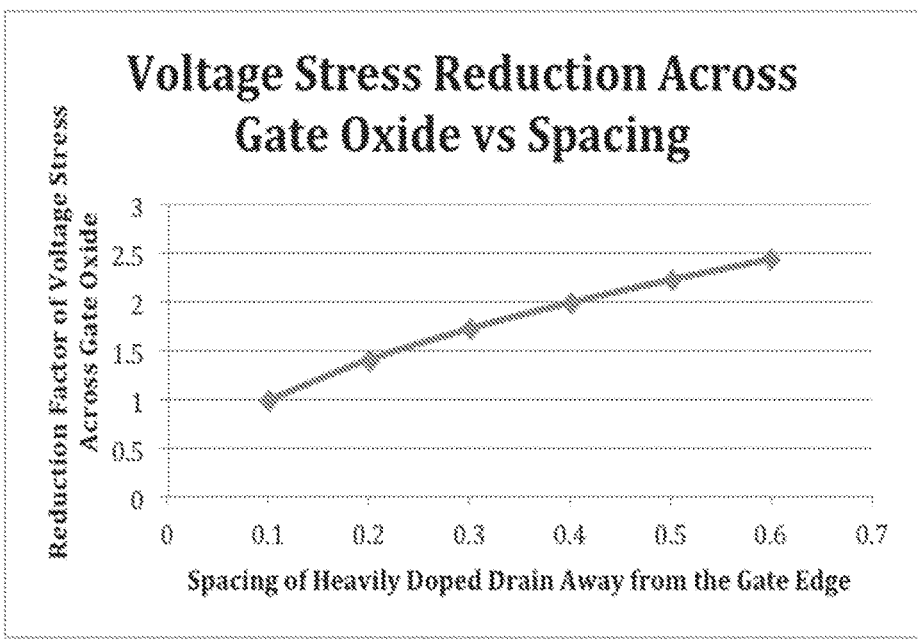
FIG. 6 is a plot showing the relationship between spacing of the heavily doped drain away from the gate edge and voltage stress across the gate oxide according to the present invention.

In addition, increasing the space of the heavily-doped drain away from the gate edge allows a larger voltage drop across the LDD region thereby reducing the voltage stress on the gate oxide. FIG. 6 presents a sample plot below showing the relationship between spacing of the heavily-doped drain away from the gate edge and voltage stress across the gate oxide.

Because of the interaction between differential LDD doping and extending the drain side LDD region, these techniques may be used in combination. Persons of ordinary skill in the art will realize that the lighter the doping of the LDD, the more the voltage is dropped and the farther away the heavily-doped drain should be from the gate edge. There is, therefore, an optimum doping and spacing of the heavily-doped drain from the gate for every design criteria. The lighter the doping, the more voltage drop can be achieved. The longer the LDD extension, the more voltage drop can be achieved. Persons of ordinary skill in the art will appreciate that a drawback of the lengthened LDD extension is the device performance will degrade and device size will increase. Thus, persons of ordinary skill in the art will appreciate that these two parameters must be optimized not only for voltage drop but for device size and performance as well.

Figure 7:
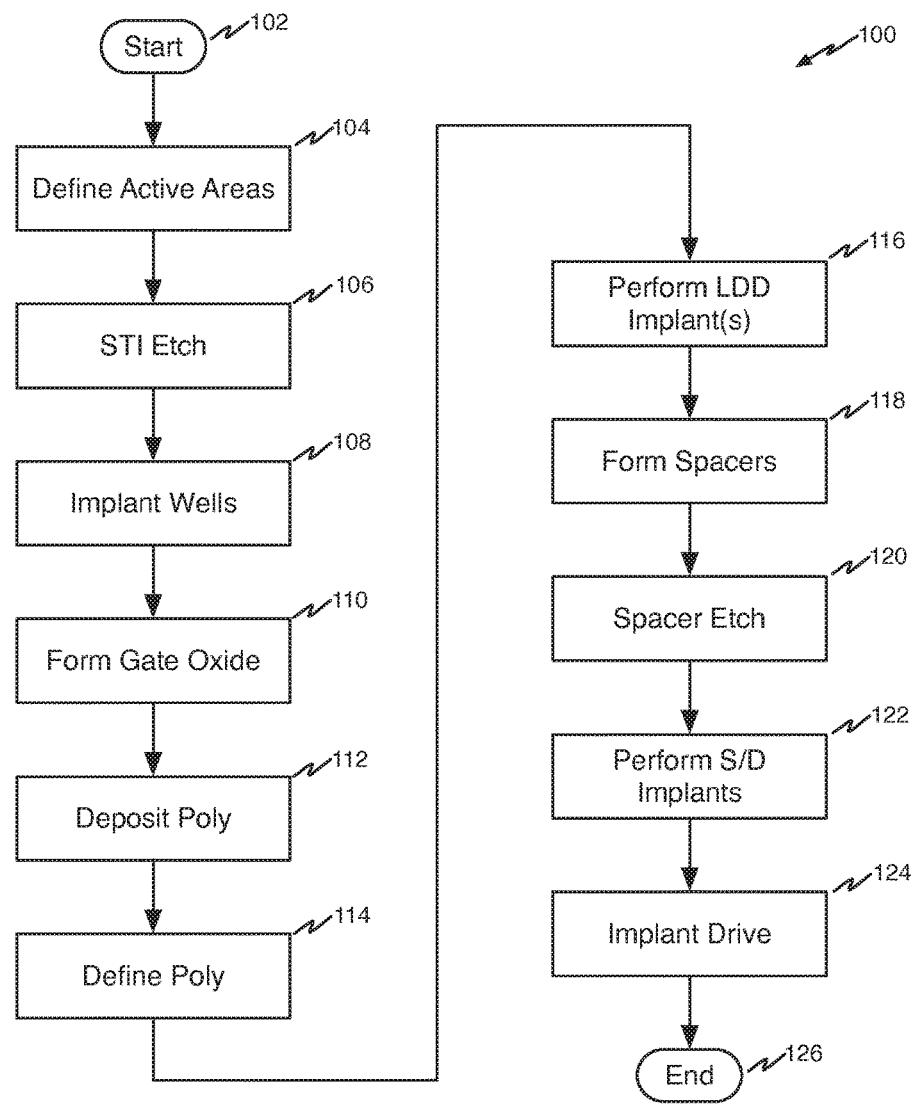
FIG. 7 is a flow diagram showing a typical process for fabricating the memory cell of the present invention.

Referring now to FIG. 7, a flow diagram shows an illustrative process 100 for fabricating the memory cell of the present invention. Conventional front-end processing steps (not shown) are performed, as is known in the art. The process 100 begins at reference numeral 102. At reference numeral 104, active device areas are defined. At reference numeral 106, shallow trench isolation regions are etched. At reference numeral 108, well regions are implanted.

At reference numeral 110, gate oxide regions are formed. At reference numeral 112, polysilicon layers with an intervening inter-poly dielectric layer are formed. At reference numeral 114, a polysilicon gate stack is defined using conventional lithography and etching steps.

At reference numeral 116, LDD implants are performed. There may be one or two implantation steps performed depending on whether the embodiment of FIG. 3 or the embodiment of FIG. 4 is being fabricated. If the embodiment of FIG. 3 is being fabricated, two separate LDD doping steps will be required to achieve the asymmetric doping of the source-side and drain-side LDD regions. At reference numerals 118 and 120, spacers are formed and then etched using conventional techniques. At reference numeral 122, source/drain implants are performed. At reference numeral 124, implants are driven in an annealing and drive step. The process 100 ends at reference numeral 126.

Persons of ordinary skill in the art will appreciate that conventional back-end steps (not shown), such as metallization and passivation, are performed to complete the integrated circuit device.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. A non-volatile memory cell, comprising:
   a p-channel non-volatile transistor having a source and a drain defining a channel and a gate overlying the channel;
   an n-channel non-volatile transistor having a source and a drain defining a channel and a gate overlying the channel;
   the drains of the p-channel non-volatile transistor and the n-channel non-volatile transistor connected together to a control line;
   a lightly-doped drain region extending from the drain of the p-channel non-volatile transistor towards the channel of the p-channel non-volatile transistor, and a lightly-doped drain region extending from the source of the p-channel non-volatile transistor towards the channel of the p-channel non-volatile transistor, the lightly-doped drain region extending from the source of the p-channel non-volatile transistor being shorter than the lightly-doped drain region extending from the drain of the p-channel non-volatile transistor.

2. The non-volatile memory cell of claim 1 further including a volatile switch transistor having a gate connected to the control line.

3. The non-volatile memory cell of claim 1 further comprising:
   a high column line connected to the source of the p-channel non-volatile transistor; and
   a low column line connected to the source of the n-channel non-volatile transistor.

4. The non-volatile memory cell of claim 1 wherein:
   the source and drain regions of the p-channel non-volatile transistor are doped with boron or $BF_2$ to a concentration of between about 1E18 atoms/cm$^3$ and about 1E20 atoms/cm$^3$; and
   the source and drain regions of the n-channel non-volatile transistor are doped with arsenic or phosphorus to a concentration of between about 1E18 atoms/cm$^3$ and about 1E20 atoms/cm$^3$.

5. The non-volatile memory cell of claim 4 wherein
   the lightly-doped drain regions of the p-channel non-volatile transistor are doped with boron to a concentration of between about 1E16 atoms/cm$^3$ and about 1E18 atoms/cm$^3$; and
   the lightly-doped drain regions of the p-channel non-volatile transistor are doped with arsenic or phosphorus to a concentration of between about 1E16 atoms/cm$^3$ and about 1E18 atoms/cm$^3$.

6. The non-volatile memory cell of claim 1 wherein:
   the lightly doped drain region on the drain side of the p-channel nonvolatile transistor extends past the channel-side of the drain region of the p-channel nonvolatile transistor by between about 0.2 μm and about 1.0 μm;
   the lightly doped drain region on the source side of the p-channel nonvolatile transistor extends past the channel-side of the source region of the p-channel nonvolatile transistor by between about 0.01 μm and about 0.1 μm;
   the lightly doped drain region on the drain side of the n-channel nonvolatile transistor extends past the channel-side of the drain region of the p-channel nonvolatile transistor by between about 0.2 µm and about 1.0 µm; and the lightly doped drain region on the source side of the n-channel nonvolatile transistor extends past the channel-side of the source region of the p-channel nonvolatile transistor by between about 0.01 µm and about 0.1 µm.

* * * * *